United States Patent [19]

Yamaoka et al.

[11] Patent Number: 5,894,229
[45] Date of Patent: Apr. 13, 1999

[54] INPUT CIRCUIT OF SEMICONDUCTOR MEMORY DEVICE FOR GENERATING AN INTERNAL SIGNAL IN ACCORDANCE WITH AN EXTERNAL SIGNAL AND FOR APPLYING IT TO AN INTERNAL CIRCUITRY

[75] Inventors: Shigeru Yamaoka; Yutaka Ikeda, both of Hyogo, Japan

[73] Assignee: Mitsubishi Denki Kabushiki Kaisha, Tokyo, Japan

[21] Appl. No.: 08/755,813

[22] Filed: Nov. 26, 1996

[30] Foreign Application Priority Data

May 24, 1996 [JP] Japan ................................ 8-129921

[51] Int. Cl.⁶ ............................................. H03K 19/0185
[52] U.S. Cl. .................... 326/83; 326/22; 326/98
[58] Field of Search ................... 326/83, 86, 21–23, 326/121, 93, 98; 327/170, 219, 225, 333

[56] References Cited

U.S. PATENT DOCUMENTS

| | | | |
|---|---|---|---|
| 4,891,792 | 1/1990 | Hanamura et al. | 326/83 |
| 5,019,724 | 5/1991 | McClure | 326/86 |
| 5,220,205 | 6/1993 | Shigehara et al. | 326/21 |
| 5,309,397 | 5/1994 | Amanai | 365/189.05 |
| 5,594,361 | 1/1997 | Campbell | 326/83 |

FOREIGN PATENT DOCUMENTS

| | | | |
|---|---|---|---|
| 0 240 061 A1 | 10/1987 | European Pat. Off. . | |
| 0444683A2 | 2/1991 | European Pat. Off. . | |
| 0 508 552 A3 | 10/1992 | European Pat. Off. . | |
| 0 667 678 A2 | 8/1995 | European Pat. Off. . | |
| 0 667 678 A3 | 8/1996 | European Pat. Off. . | |
| 1-183217 | 7/1989 | Japan | 326/83 |
| 2309810 | 12/1990 | Japan . | |
| 5-14169 | 1/1993 | Japan . | |
| 5-55896 | 3/1993 | Japan | 326/121 |
| 5-335898 | 12/1993 | Japan | 326/83 |
| 6-303123 | 10/1994 | Japan . | |
| 9-186580 | 3/1995 | Japan | 362/22 |

OTHER PUBLICATIONS

Millman et al., Microelectronics, McGraw–Hill, pp. 220 and 219, 1987.

*Primary Examiner*—Jon Santamauro
*Assistant Examiner*—Don Phu Le
*Attorney, Agent, or Firm*—McDermott, Will & Emery

[57] ABSTRACT

In a DRAM, first and second P channel MOS transistors are connected in series between an output node of an NOR gate of an input buffer and a power supply line. The first P channel MOS transistor receives at its gate an external signal /EXT and the second P channel MOS transistor receives at its gate an inverted signal of an output enable signal OEM. In a data output period, the signal OEM attains to the "H" level and the second P channel MOS transistor is rendered conductive, and therefore, even when power supply potential Vcc lowers in the data output period, the output node can be sufficiently charged, and an internal signal /INT can be generated stably.

4 Claims, 5 Drawing Sheets

5,894,229

1

INPUT CIRCUIT OF SEMICONDUCTOR MEMORY DEVICE FOR GENERATING AN INTERNAL SIGNAL IN ACCORDANCE WITH AN EXTERNAL SIGNAL AND FOR APPLYING IT TO AN INTERNAL CIRCUITRY

BACKGROUND OF THE INVENTION

1. Field of the Invention

The present invention relates to an input circuit for a semiconductor memory device and, more particularly, to an input circuit for a semiconductor memory device for generating an internal signal in accordance with an external signal changing from a first logical potential to a second logical potential at a certain time point, and for applying the internal signal to an internal circuitry.

2. Description of the Background Art

Conventionally, at various control signal input terminals of a dynamic random access memory (hereinafter referred to as a DRAM), an input buffer for converting an externally applied control signal /EXT to an internal control signal /INT and for applying it to an internal circuitry has been provided.

FIG. 8 is a schematic diagram showing the structure of a conventional input buffer 80 for a DRAM.

Referring to FIG. 8, input buffer 80 includes an NOR gate 81, an inverter 82 and a P channel MOS transistor 83. One input node 81a of NOR gate 81 receives an external signal /EXT, and the other input node 81b is connected to a line 71 at the ground potential GND (hereinafter referred to as the ground line).

NOR gate 81 includes, as shown in FIG. 9, P channel MOS transistors 91 and 92 connected in series between power supply line 70 and output node N81, and N channel MOS transistors 93 and 94 connected in parallel between output node N81 and ground line 71. MOS transistors 92 and 93 have their gates connected to one input node 81a, and MOS transistors 91 and 94 have their gates connected to the other input node 81b. Since the other input node 81b of NOR gate 81 is grounded, NOR gate 81 operates as an inverter consisting of MOS transistors 92 and 93 with respect to external signal /EXT.

Inverter 82 receives an output from NOR gate 81 and outputs an internal signal /INT. P channel MOS transistor 83 is connected between a line of a power supply potential Vcc (hereinafter referred to as the power supply line) 70 and an input node of an inverter 82, and receives at its gate an output from inverter 82. Inverter 82 and P channel MOS transistor 83 constitute a half latch circuit.

When the external signal /EXT falls from an inactive "H" level to an active "L" level, the output from inverter 82, that is, internal signal /INT falls from the "H" level to the "L" level, P channel MOS transistor 83 is rendered conductive and internal signal /INT is latched at the "L" level. When external signal /EXT rises from the active level of "L" to the inactive level of "H", internal signal /INT rises from "L" level to "H" level, P channel MOS transistor 83 is rendered non-conductive, and the half latch is canceled.

Since the conventional input buffer 80 is structured as described above, when data output from DRAM is started and power supply potential Vcc lowers temporarily while the external signal /EXT is at the active level of "L", the potential at output node N81 of NOR gate 81 lowers, and the output from inverter 82, that is, the level of internal signal /INT rises slightly. This may result in a malfunction of an internal circuitry which is controlled by the internal signal /INT.

2

SUMMARY OF THE INVENTION

Therefore, an object of the present invention is to provide an input circuit of a semiconductor memory device which operates stably even in a data output period.

According to an aspect of the present invention, first and third transistors for charging and a second transistor for discharging are provided, and the first and second transistors only are used normally and the first to third transistors are all used in the data output period. Therefore, even when the power supply potential lowers temporarily in the data output period, the output node can be sufficiently charged. This enables stable generation of the internal signal, and hence malfunction of the internal circuitry can be prevented.

According to another aspect of the present invention, a first inverting circuit which is activated in the data output period and is highly sensitive to an external input signal, and a second inverting circuit activated in other period and is less sensitive to external signal are provided, and an internal signal is generated in response to inversion of at least one of the outputs from the first and second inverting circuits. Therefore, even when the power supply potential lowers temporarily in the data output period, the internal signal can be generated stably based on the output from the first inverting circuit, and hence malfunction of the internal circuitry can be prevented.

According to a further aspect of the present invention, a first inverting circuit highly sensitive to an external signal and a second inverting circuit less sensitive to an external signal are provided. In the data output period, an internal signal is generated in response to inversion of at least one of the outputs from the first and second inverting circuit, and the internal signal is generated in response to inversion of both of the outputs from the first and second inverting circuits in other period. Therefore, even when the power supply potential lowers temporarily in the data output period, the internal signal can be generated stably based on the output from the first inverting circuit, and malfunction of the internal circuitry can be prevented.

According to a still further aspect of the present invention, first and second transistors for charging an input node of a half latch circuit and a pulse generating circuit for outputting a pulse signal at the start of data output are provided. In a period in which the pulse is being output from the pulse generating circuit, the first and second transistors are used, and in other period, only the first transistor is used. Therefore, even when the power supply potential lowers temporarily at the start of data output, the input node of the half latch circuit can be sufficiently charged. Therefore, the internal signal can be generated stably and malfunction of the internal circuitry can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
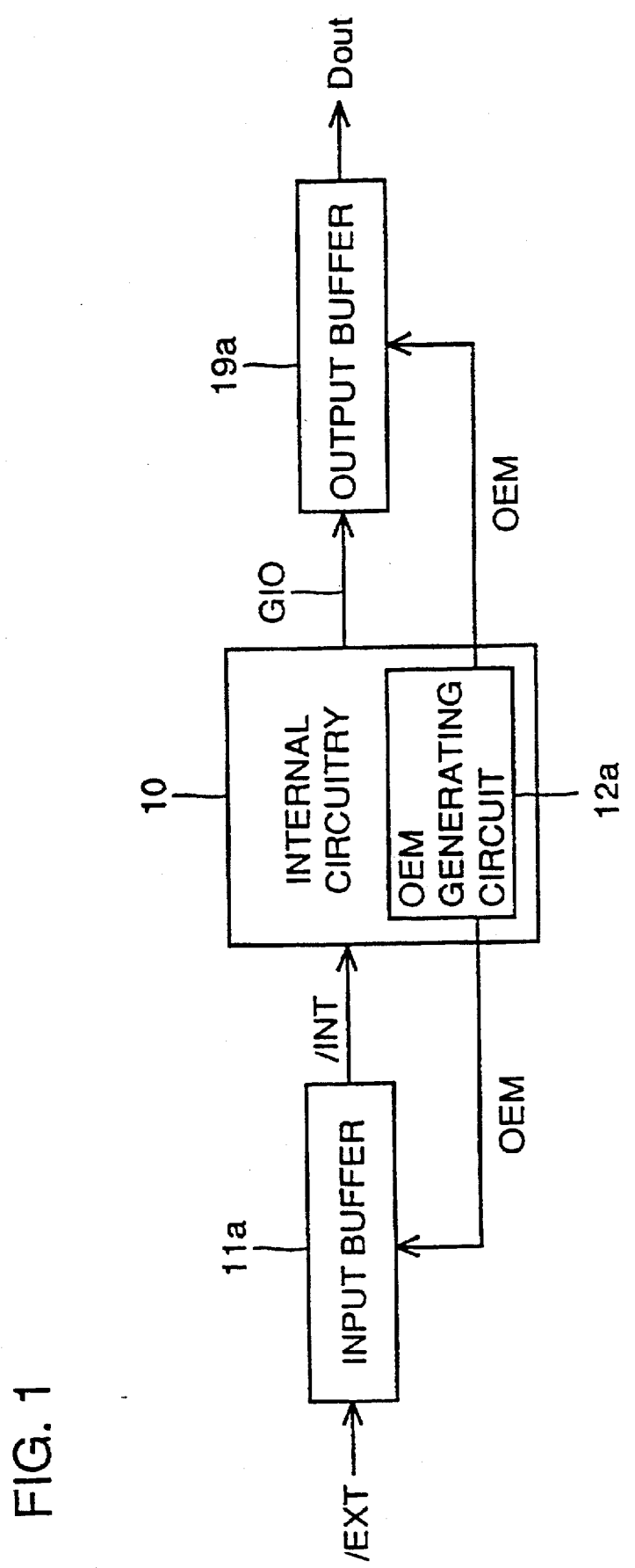
FIG. 1 is a block diagram showing the principle of the present invention.

Prior to the description of the embodiments, the principle of the present invention will be described. FIG. 1 is a block diagram showing the structure of the DRAM in reading operation.

Referring to FIG. 1, an input buffer 11a generates an internal signal /INT in accordance with an external signal /EXT and applies it to an internal circuitry 10. Internal circuitry 10 applies data read from the memory cell array in accordance with the internal signal /INT to output buffer 19a through a global signal input/output line pair GIO. An OEM generating circuit 12a included in internal circuitry 10 applies an output enable signal OEM to output buffer 19a at a prescribed timing. Output buffer 19a amplifies and externally outputs the data applied from internal circuitry 10, in response to the output enable signal OEM.

It is likely that a power supply noise is generated during the data output period, resulting in malfunction ($V_{IL}$ defect) of input buffer 11a. The present invention is made to prevent malfunction of input buffer 11a in the data output period, by applying the output enable signal OEM also to input buffer 11a so as to increase the ratio of the charging current and the discharging current of the first stage inverter of input buffer 11a in response to the output enable signal OEM, or to increase latching capability of a half latch circuit in response to the output enable signal OEM.

The invention will be described in greater detail with reference to the figures.

[First Embodiment]

Figure 2:
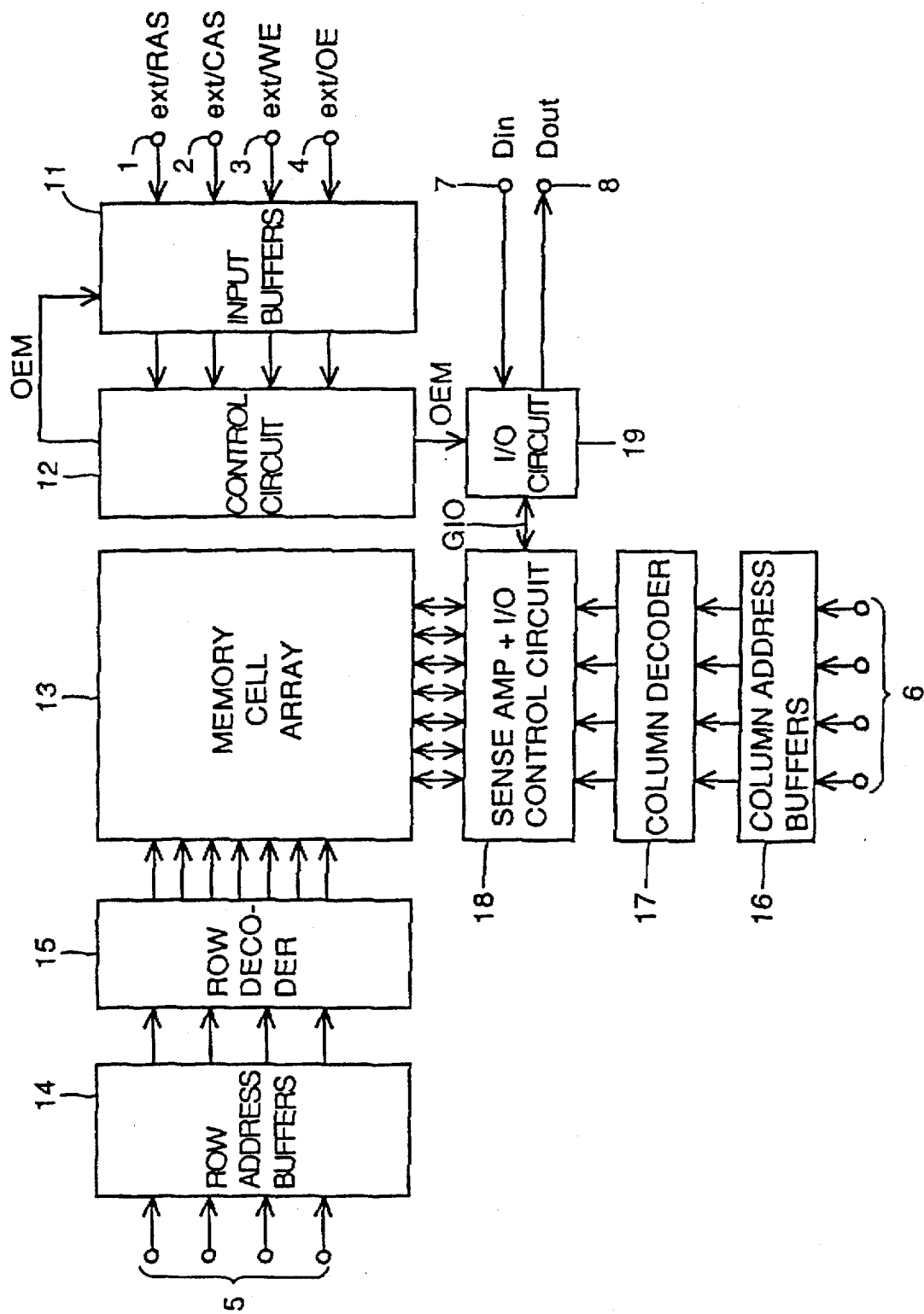
FIG. 2 is a block diagram showing a structure of the DRAM in accordance with a first embodiment of the present invention.

FIG. 2 is a block diagram showing a structure of the DRAM in accordance with the first embodiment of the present invention. Referring to FIG. 2, the DRAM includes control signal input terminals 1 to 4, row address signal input terminals 5, column address signal input terminals 6, a data input terminal 7 and a data output terminal 8. Further, DRAM includes input buffers 11, a control circuit 12, a memory cell array 13, row address buffers 14, a row decoder 15, column address buffers 16, a column decoder 17, a sense amplifier+input/output control circuit 18 and an input/output circuit 19.

Input buffers 11 include input buffers 11a provided corresponding to control signal input terminals 1 to 4, respectively, which convert control signals ext/RAS, ext/CAS, ext/WE and ext/OE externally applied through control signal input terminals 1 to 4 to internal signals and apply these to control circuit 12. Control circuit 12 selects a prescribed operation mode based on the internal signals applied from input buffers 11, and controls the DRAM in its entirety.

Memory cell array 13 includes a plurality of memory cells each storing 1 bit of data. Each memory cell is arranged at a prescribed address determined by row and column addresses.

Row address buffers 14 convert row address signals externally applied through address signal input terminals 5 to internal row address signals, and apply these to row decoder 15. Row recorder 15 designates a row address of memory cell array 13 in response to the internal row address signals applied from row address buffers 14.

Column address buffers 16 convert column address signals externally applied through column address signal input terminals 6 to internal column address signals and apply these to column decoder 17. Column decoder 17 designates a column address of memory cell array 13 in response to the internal column address signals applied from column address buffers 16.

Sense amplifier+input/output control circuit 18 connects a memory cell of the address designated by the row decoder 15 and a column decoder 17 to one end of the global signal input/output line pair GIO.

The other end of global signal input/output line pair GIO is connected to input/output circuit 19. Input/output circuit 19 applies the data input from data input terminal 7 to the selected memory cell through global signal input/output line pair GIO in writing operation, and outputs data read from the selected memory cell to data output terminal 8 in the reading operation.

Input buffer 11a of FIG. 1 is included in input buffers 11 of FIG. 2, OEM generating circuit 12a of FIG. 1 is included in control circuit 12 of FIG. 2, output buffer 19a of FIG. 1 is included in input/output circuit 19 of FIG. 2, and internal circuitry 10 of FIG. 1 represents all the circuits of FIG. 2 other than input buffers 11 and input/output circuit 19.

Figure 3:
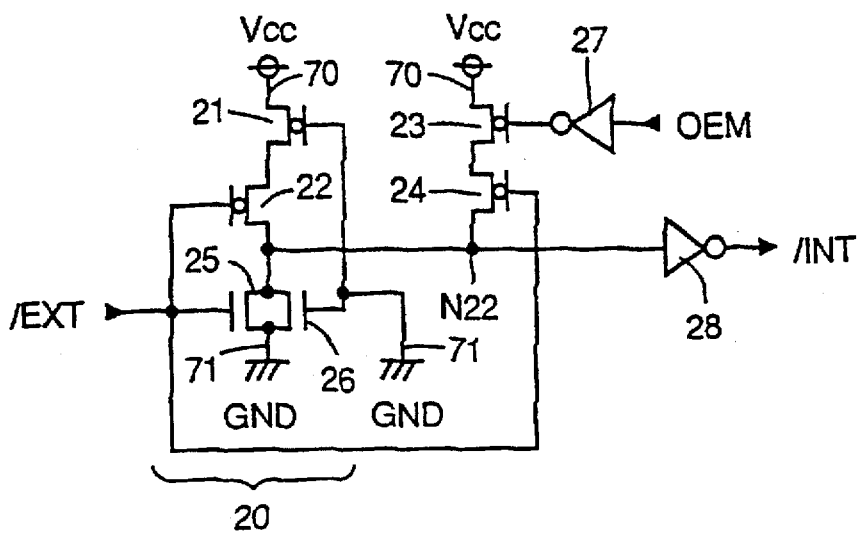
FIG. 3 is a schematic diagram showing a structure of an input buffer of the DRAM shown in FIG. 2.

FIG. 3 is a schematic diagram showing a structure of input buffer 11a. Referring to FIG. 3, input buffer 11a includes P channel MOS transistors 21 to 24, N channel MOS transistors 25 and 26 and inverters 27 and 28. P channel MOS transistors 21 and 22 and N channel MOS transistors 25 and 26 constitute an NOR gate 20. P channel MOS transistors 21 and 22 are connected in series between power supply line 70 and a node N22 and N channel MOS transistors 25 and 26 are connected in parallel between node 22 and ground line 71. MOS transistor 22 and 25 both receive at their gates the external signal /EXT (ext/RAS, ext/CAS, ext/WE or ext/OE). MOS transistors 21 and 26 have their gates both grounded.

P channel MOS transistors 23 and 24 are connected in series between power supply line 70 and node N22. Output enable signal OEM is input through inverter 27 to the gate of P channel MOS transistor 23. P channel MOS transistor 24 has its gate connected to the gates of MOS transistors 22 and 25. Inverter 28 has its input node connected to node N22, and an output of which will be the internal signal /INT.

The operation of input buffer 11a shown in FIG. 3 will be described. In a period in which output enable signal OEM is at an inactive "L" level and data is not output from output buffer 19a, P channel MOS transistor 23 is non-conductive. Therefore, when external signals /EXT is at the "H" level, charges at node N22 flow to the ground line 71 through N channel MOS transistor 25, node N22 is discharged to the "L" level and internal signal /INT attains to the "H" level. When external signal /EXT is at the "L" level, charges flow from power supply line 70 through P channel MOS transistors 21 and 22 into node N22, node N22 is charged to the "H" level and internal signal /INT attains to the "L" level.

In the period in which output enable signal OEM is at the active level of "H" and data is being output from output buffer 19a, P channel MOS transistor 23 is rendered conductive. Therefore, when external signal /EXT is at the "H"

level, charges at node N22 flow out through N channel MOS transistor 25 to ground line 71, node N22 is discharged to the "L" level and internal signal /INT attains to the "H" level. When external signal /EXT attains to the "L" level, charges flow from power supply line 70 through P channel MOS transistors 21 and 22 to node N22 as well as through P channel MOS transistors 23 and 24 to node N22, so that node N22 is charged to the "H" level and the internal signal /INT attains to the "L" level.

In this embodiment, in the data output period, the number of transistors for charging node N22 is increased from normal one (P channel MOS transistor 22) to two (P channel MOS transistors 22 and 24) and charging capability is increased. Therefore, even when the power supply potential Vcc lowers temporarily in the data output period, node N22 can be charged sufficiently. Therefore, internal signal /INT can be generated stably even in a data output period and malfunction of the internal circuitry 10 can be prevented.

[Second Embodiment]

Figure 4:
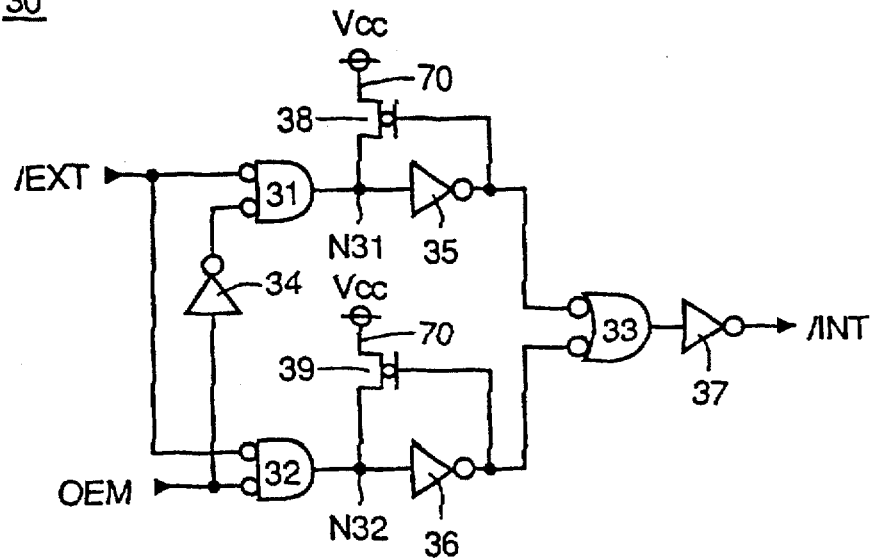
FIG. 4 is a schematic diagram showing a structure of an input buffer of a DRAM in accordance with a second embodiment of the present invention.

FIG. 4 is a schematic diagram showing a structure of an input buffer 30 of the DRAM in accordance with a second embodiment of the present invention.

Referring to FIG. 4, input buffer 30 includes NOR gate 31 and 32, an NAND gate 33, inverters 34 to 37 and P channel MOS transistors 38 and 39. The ratio of the charging current and the discharging current of NOR gate 31 is set to be larger than that of NOR gate 32. More specifically, the drivability of P channel MOS transistor (P channel MOS transistors 21 and 22 of FIG. 3) for charging NOR gate 31 is set higher than that of NOR gate 32. In other words, the threshold value ($V_{IL}$ level) of NOR gate 31 with respect to the external signal /EXT is set higher than the threshold value of NOR gate 32. The threshold value of NOR gate 31 is set such that it is optimized in the data output period, while the threshold value of NOR gate 32 is set such that it is optimized in other period.

The external signal /EXT is input to one input node of each of NOR gates 31 and 32. Output enable signal OEM is input through inverter 34 to the other input node of NOR gate 31 and directly to the other input node NOR gate 32. The output from NOR gate 31 is input to one input node of AND gate 33 through inverter 35. P channel MOS transistor 38 is connected between power supply line 70 and an input node of inverter 35, and receives at its gates an output from inverter 35. Inverter 35 and P channel MOS transistor 38 constitute a half latch circuit. An output from NOR gate 32 is input to the other input node of NAND gate 33 through inverter 36. P channel MOS transistor 39 is connected between power supply line 70 and an input node of inverter 36, and it receives at its gate the output from inverter 36. Inverter 36 and P channel MOS transistor 39 constitute a half latch circuit. An output from NAND gate 33 is input to inverter 37 and the output from inverter 37 is the internal signal /INT.

The operation of the input buffer 30 shown in FIG. 4 will be described. In the period in which output enable signal OEM is at the "L" level and data is not output from output buffer 19a, FIG. 1 the output from NOR gate 31 is fixed at the "L" level, NAND gate 33 operates as an inverter for the output of the inverter 36, and NOR gate 32 operates as an inverter for the external signal /EXT.

Therefore, when the external signal /EXT is at the "H" level, the output node N32 of NOR gate 32 is discharged to the "L" level, and internal signal /INT attains to the "H" level. When the external signal /EXT attains to the "L" level, the output node N32 of NOR gate 32 is charged to the "H" level, and internal signal /INT attains to the "L" level.

In the period in which the output enable signal OEM is at the "H" level and data is being output from output buffer 19a, the output from NOR gate 32 is fixed at the "L" level, AND gate 33 operates as an inverter for the output from inverter 35, and NOR gate 31 operates as an inverter for external signal /EXT. Therefore, when the external signal /EXT is at the "H" level, the output node N31 of NOR gate 31 is discharged to the "L" level, and internal signal /INT attains to the "H" level. When the external signal /EXT attains to the "L" level, the output node N31 of NOR gate 31 is charged to the "H" level, and internal signal /INT attains to the "L" level.

In this embodiment, an NOR gate 31 having high ratio is used in the data output period, and NOR gate 32 having low ratio is used in other period. Therefore, the internal signal /INT can be generated stably in every period, and malfunction of the internal circuitry 10 can be prevented.

[Third Embodiment]

Figure 5:
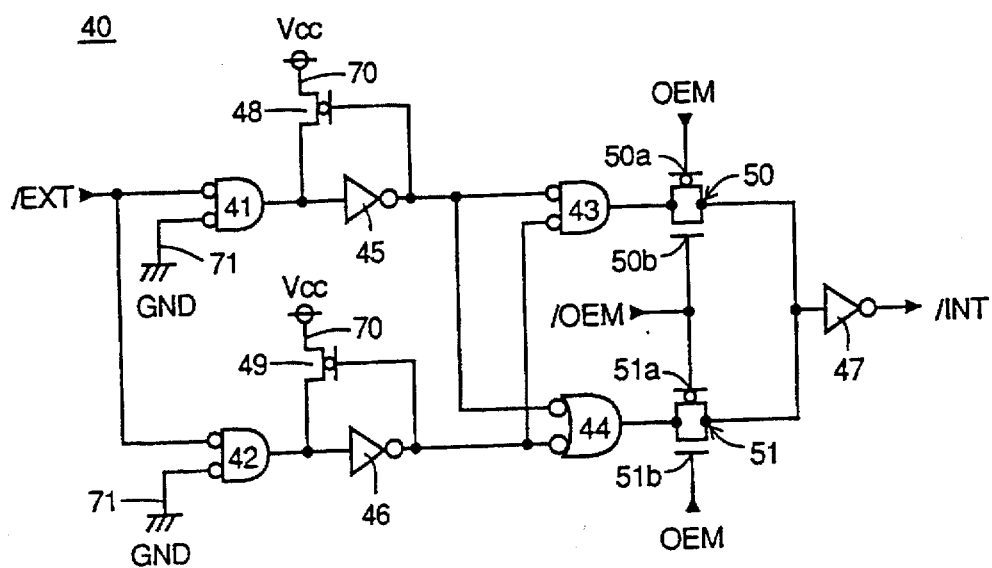
FIG. 5 is a schematic diagram showing a structure of an input buffer of a DRAM in accordance with a third embodiment of the present invention.

FIG. 5 is a schematic diagram showing a structure of an input buffer 40 of a DRAM in accordance with a third embodiment of the present invention.

Referring to FIG. 5, input buffer 40 includes NOR gates 41 to 43, an NAND gate 44, inverters 45 to 47, P channel MOS transistors 48 and 49 and transfer gates 50 and 51. The ratio of the charging current and the discharging current of NOR gate 41 is set higher than the ratio of NOR gate 42.

NOR gates 41 and 42 both receive the external signal /EXT each at one input node, and each have the other input node grounded. The output from NOR gate 41 is input to one input node of NOR gate 43 and one input node of NAND gate 44, through inverter 45. The output from NOR gate 42 is input to the other input of NOR gate 43 and the other input node of NAND gate 44, through inverter 46. P channel MOS transistor 48 is connected between power supply line 70 and an input node of inverter 45, and receives at its gate an output from inverter 45. P channel MOS transistor 49 is connected between power supply line 70 and an input node of inverter 46 and receives at its gate an output from inverter 46.

Transfer gate 50 is connected between an output node of NOR gate 43 and an input node of inverter 47, and receives at its gate 50a on the side of P channel MOS transistor, the signal OEM, and receives at its gate 50b on the side of N channel MOS transistor, an inverted signal /OEM of signal OEM. Transfer gate 51 is connected between an output node of NAND gate 44 and an input node of inverter 47, and receives at its gate 51a on the side of P channel MOS transistor the inverted signal /OEM of signal OEM, and receives at its gate 51b on the side of N channel MOS transistor, the signal OEM. The output from inverter 47 is the internal signal /INT.

The operation of input buffer 40 shown in FIG. 5 will be described. In a period in which the output enable signal OEM is at the "L" level and data is not output from output buffer 19a, transfer gate 50 is rendered conductive, and transfer gate 51 is rendered non-conductive. Therefore, when external signal /EXT attains to the "L" and both outputs from NOR gates 41 and 42 attain to the "H" level, the internal signal /INT attains to the "L" level.

In the period in which the output enable signal OEM is at the "H" level and data is being output from output buffer 19a, transfer gate 51 is rendered conductive and transfer gate 50 is rendered non-conductive. Therefore, internal signal /INT attains to the "L" level when external signal /EXT attains to the "L" level and at least one of the outputs from NOR gates 41 and 42 attains to the "H" level.

In this embodiment, similar effects as the second embodiment can be obtained, and in addition, the internal signal /INT can be applied to the internal circuitry 10 immediately in the data output period, and surely in other period.

[Fourth Embodiment]

Figure 6:
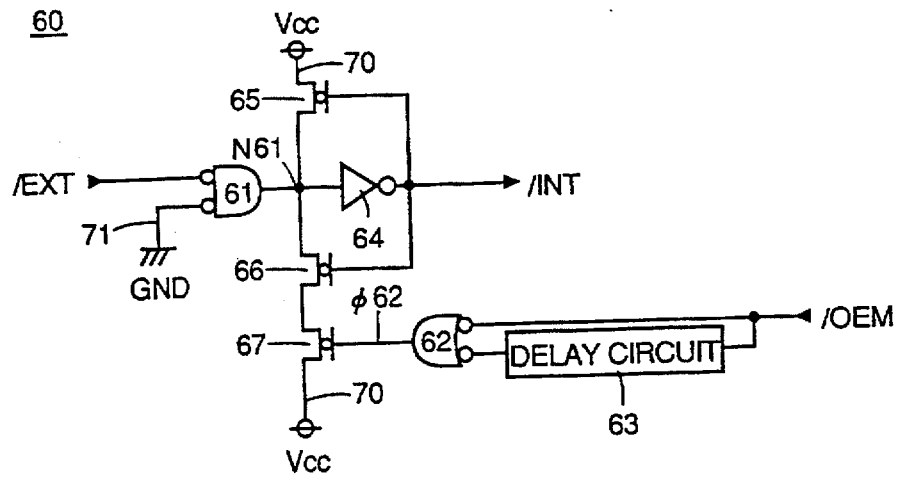
FIG. 6 is a schematic block diagram showing a structure of an input buffer of a DRAM in accordance with a first embodiment of the present invention.

FIG. 6 is a schematic block diagram showing a structure of an input buffer 60 of the DRAM in accordance with a fourth embodiment of the present invention.

Referring to FIG. 6, input buffer 60 includes an NOR gate 61, an AND gate 62, a delay circuit 63, an inverter 64 and P channel MOS transistors 65 to 67. NOR gate 61 receives at its one input node the external signal /EXT, has the other input node grounded and its output is input to inverter 64. An output from inverter 64 is the internal signal /INT.

P channel MOS transistor 65 is connected between power supply line 70 and input node N61 of inverter 60, and receives at its gate the output from inverter 64. P channel MOS transistors 67 and 66 are connected in series between power supply line 70 and input node N61 of inverter 64, and P channel MOS transistor 66 receives at its gate the output from inverter 64.

The signal OEM is input to one input node of NAND gate 62 through delay circuit 63, and directly input to the other input node of NAND gate 62. The output φ62 of NAND gate 62 is input to the gate of P channel MOS transistor 67.

Figure 7:
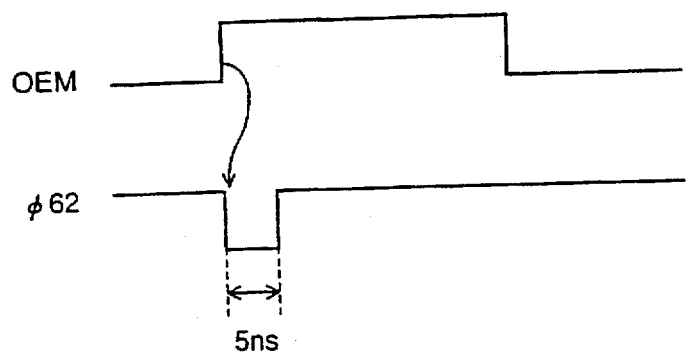
FIG. 7 is a time chart showing the operation of the input buffer shown in FIG. 6.

Delay circuit 63 includes odd-numbered inverters connected in series, and has a delay time of 5 ns. NAND gate 62 and delay circuit 63 constitute a pulse generating circuit and outputs a negative pulse having a pulse width of 5 ns in response to the rise of the signal OEM from the "L" level to the "H" level as shown in FIG. 7.

Figure 8:
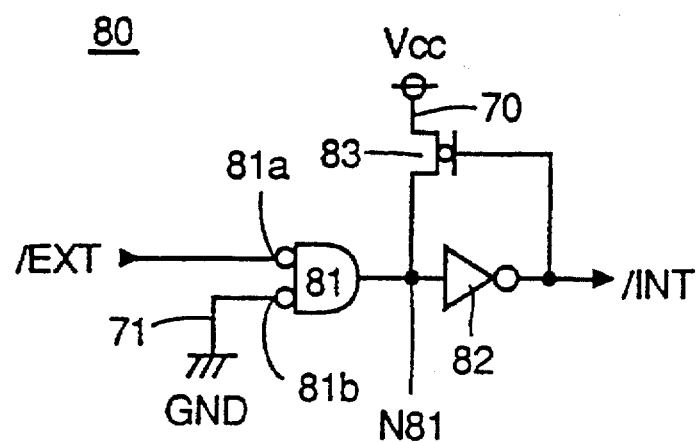
FIG. 8 is a schematic diagram showing a structure of an input of a conventional DRAM.
Figure 9:
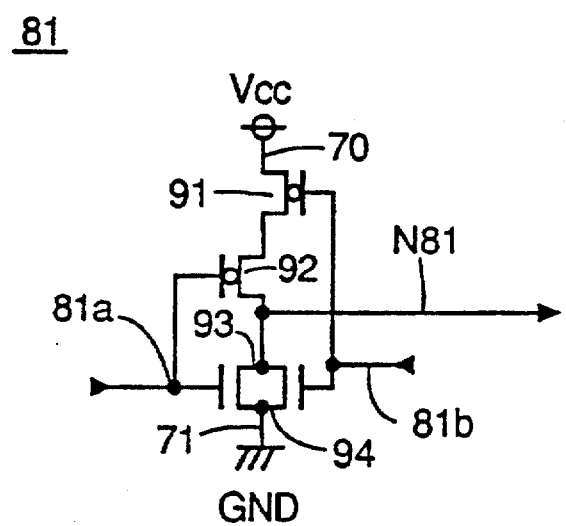
FIG. 9 is a schematic diagram showing the structure of the NOR gate shown in FIG. 8.

The operation of the input buffer 60 will be described. In the period in which output enable signal OEM is at the "L" level and data is not output from output buffer 19a, the output φ62 of NAND gate 62 attains to the "H" level, and P channel MOS transistor 67 is rendered non-conductive. In this case, input buffer 60 has the same structure as the conventional input buffer 80 shown in FIG. 8.

When the output enable signal OEM rises from the "L" level to the "H" level and data output from output buffer 19a starts, a negative pulse is output from NAND gate 62, and P channel MOS transistor 67 is conductive for 5 ns. Therefore, when external signal /EXT falls from the "H" level to the "L" level in this period of 5 ns, the input node N61 of inverter 64 is charged by two pulses, that is, through P channel MOS transistor 65 and through P channel MOS transistors 66 and 67. After the lapse of 5ns, P channel MOS transistor 67 is rendered non-conductive, and charging of input N61 of inverter 64 is carried out only by P channel MOS transistor 65.

In this embodiment, the number of transistors for charging input node N61 of inverter 64 is increased from normal one (P channel MOS transistor 65) to two (P channel MOS transistors 65 and 66) for 5 ns from the start of data output to increase charging capability. Therefore, even when power supply potential Vcc lowers in this period, input node N61 of inverter 64 can be sufficiently charged. Therefore, internal signal /IND can be generated stably, and malfunction of the internal circuitry can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

an input circuit for generating an internal signal in accordance with an external signal changing from a first logical potential to a second logical potential at a certain time point;

internal circuitry for reading/writing data in accordance with the internal signal generated by said input circuit; and an output circuit responsive to an output enable signal for externally outputting read data of said internal circuitry; wherein said input circuit includes:

a first transistor of a first conductivity type connected between a line of a first power supply potential and an output node, receiving said external signal at its input electrode, and being rendered conductive in response to the change of said external signal from said first logical potential to said second logical potential;

a second transistor of a second conductivity type connected between a line of a second power supply potential different from said first power supply potential and said output node, receiving said external signal at its input electrode, and being rendered non-conductive in response to the change of said external signal from said first logical potential to said second logical potential;

a third transistor of the first conductivity type receiving said external signal at its input electrode; and connecting means for connecting said third transistor between said line of the first power supply potential and said output node in response to said output enable signal.

2. An input circuit of a semiconductor memory device for generating an internal signal in accordance with an external signal changing from a first logical potential to a second logical potential at a certain time point and for applying the internal signal to an internal circuitry, comprising:

a first inverting circuit activated in a data output period of said semiconductor memory device, having a first threshold potential between said first logical potential and said second logical potential, for outputting an inverted signal of said external signal;

a second inverting circuit activated in a period other than the data output period of said semiconductor memory device, having a threshold potential between said first threshold potential and said second logical potential, for outputting an inverted signal of said external signal; and a logic circuit for generating said internal signal in response to an output of said first logical potential from at least one of said first and second inverting circuits.

3. An input circuit of a semiconductor memory device for generating an internal signal in accordance with an external signal changing from a first logical potential to a second logical potential at a certain time point and for applying the internal signal to an internal circuitry, comprising:

a first inverting circuit having a first threshold potential between said first logical potential and said second logical potential, for outputting an inverting signal of said external signal;

a second inverting circuit having a second threshold potential between said first threshold potential and said second logical potential, for outputting an inverted signal of said external signal;

a first logic circuit for generating said internal signal in response to an output of said first logical potential from at least one of said first and second inverting circuits;

a second logic circuit for generating said internal signal in response to an output of said first logical potential from both of said first and second inverting circuits; and switching means for coupling said first logic circuit to said internal circuitry in the data output period of said semiconductor memory device and for coupling said second logic circuit to said internal circuitry in other period.

4. An input circuit of a semiconductor memory device for generating an internal signal in accordance with an external signal changing from a first logical potential to a second logical potential at a certain time point, and for applying the internal signal to an internal circuitry, comprising:

first and second inverting circuits connected in series for generating said internal signal in accordance with said external signal;

a first transistor connected between a line of a prescribed potential and an input node of said second inverting circuit, having an input electrode connected to an output node of said second inverting circuit, rendered conductive in response to change of an output from said second inverting circuit from said first logical potential to said second logical potential, for fixing the output of said second inverting circuit at said second logical potential;

a second transistor same in conductivity type as said first transistor, having an input electrode connected to the output node of said second inverting circuit;

pulse generating means for outputting a pulse signal of a prescribed pulse width in response to start of data output from said semiconductor memory device; and connecting means for connecting said second transistor between the line of said power supply line potential and the input node of said second inverting circuit only in a period in which said pulse signal is output from said pulse generating means.

* * * * *